United States Patent [19]

Main

[11] Patent Number: 4,567,441
[45] Date of Patent: Jan. 28, 1986

[54] CIRCUIT AND METHOD FOR LINEARIZING THE OUTPUT SIGNAL OF AN FM DETECTOR

[75] Inventor: William E. Main, Mesa, Ariz.

[73] Assignee: Motorola, Inc., Schaumburg, Ill.

[21] Appl. No.: 595,871

[22] Filed: Apr. 2, 1984

[51] Int. Cl.$^4$ .............................................. H03D 3/06
[52] U.S. Cl. .................................. 329/103; 329/110; 329/145; 329/168; 329/204; 455/214
[58] Field of Search ............... 329/101, 103, 110, 145, 329/168, 169, 203, 204, 205 R; 455/214, 337

[56] References Cited

U.S. PATENT DOCUMENTS 4,127,825 11/1978 Blomley .............................. 329/103
4,375,618 3/1983 Jett, Jr. ................................ 329/103

Primary Examiner—Siegfried H. Grimm
Attorney, Agent, or Firm—Michael D. Bingham

[57] ABSTRACT

An output load circuit having a non-linear transfer characteristic is coupled to the differential output of a conventional quadrature detector which produces a more linear version of the S-curve characteristics of the detector. The load circuit comprises differentially connected transistors each having their collector-emitter paths coupled to respective outputs of the multiplied portion of the quadrature demodulator wherein the non-linear differential output signal therefrom drives the non-linear transfer function of the base-emitter junction of the differentially coupled transistors to produce a linear output voltage at the base thereof.

9 Claims, 5 Drawing Figures

— *PRIOR ART* —

CIRCUIT AND METHOD FOR LINEARIZING THE OUTPUT SIGNAL OF AN FM DETECTOR

BACKGROUND OF THE INVENTION

The present invention relates to FM-IF receiver systems and, more particularly, to a circuit and method for linearizing the output signal produced at the output of a quadrature detector of such systems.

The use of quadrature detectors/demodulators in FM receivers to translate a frequency modulated input signal to an amplitude modulated output signal is well known in the art. For example, U.S. Pat. No. 3,548,326 discloses a FM-IF receiver utilizing a quadrature detector. Typically, the quadrature detector comprises a multiplier or gating circuit which is responsive to two input signals. The first input signal is utilized as a reference or switching signal and is generated from the FM-IF limiter stage of the receiver preceding the multiplier. The second input signal is generated from the first input signal being passed through a phase shift network comprising a quadrature coil and capacitor tuned tank circuit. This LC tuned circuit provides the second input signal which is in quadrature phase with respect to the switching or reference signal. The two input signals produce an output signal at the differential outputs of the multiplier that is proportional to the phase difference therebetween. FIG. 1, herein, illustrates such a quadrature detector. In many applications the differential outputs of the multiplier circuit are connected to a differential-to-single ended conversion circuit for providing a single ended output signal. The quadrature detector output signal can then be integrated to produce the audio output signal.

A dominant source of distortion in many FM receiver systems arises from the use of the type of quadrature demodulators aforedescribed. This distortion is related primarily to the third harmonic frequency of the FM carrier frequency and is known as third harmonic distortion (THD). One source of THD is due to the use of a single tuned quadrature coil that is utilized in the phase shifting network of the detector.

One prior art FM-IF system, in an attempt to eliminate or reduce THD, utilizes a double tuned tank circuit. However, not only are additional components required by this system, but it is difficult to align in production assembly. Therefore, this system is not only costly but is undesirable for mass production of FM receiver systems. Another prior art system utilizes a single tuned quadrature coil and feedback in an attempt to reduce THD. In this system the output of the multiplier is supplied to a full wave rectifier, the output of which is returned to the multiplier. Any second harmonic frequencies of the FM carrier signal generated by the full wave rectifier are recombined by the multiplier in an attempt to produce additional third harmonics of the carrier signal which tend to cancel the third harmonic frequencies produced from the carrier signal directly through the multiplier. However, besides requiring additional circuitry which increases circuit complexity as well as production costs, this prior art summing technique is not exact and may also produce higher order harmonics of the carrier signal that can distort the reproduced audio signal.

Thus, there is a need for a circuit and method that can be used to linearize the output signal generated from quadrature detectors of FM/IF receivers in order to reduce third harmonic distortion.

SUMMARY OF THE INVENTION

Accordingly, it is an object of the present invention to provide an improved circuit and method for linearizing the output signal produced by a quadrature detector.

Another object of the present invention is to provide an improved quadrature detector.

Still another object of the present invention is to provide an improved quadrature detector having a nonlinear load circuit which provides a more linear version of an output signal than prior quadrature detectors.

In accordance with the above and other objects there is provided a circuit for linearizing the amplitude modulated output signal appearing at the differential outputs of a quadrature detector which includes a multiplier circuit that receives a frequency modulated input signal wherein the circuit comprises a load circuit having non-linear transfer characteristics coupled with the differential outputs of the multiplier.

In a feature of the invention the load circuit includes a pair of transistors having respective emitters differentially connected to a current source and collectors coupled to respective outputs of the multiplier. The base of the first transistor is coupled to a reference potential with the base of the second transistor receiving a feedback signal. A feedback circuit which includes an operational amplifier having inverting and noninverting inputs coupled to the differential outputs of the multiplier respectively provides the feedback signal through a resistive divider circuit to the base of the second transistor such that a linear output voltage is produced at the output of the operational amplifier corresponding to the amplitude modulated output signal.

DETAILED DESCRIPTION OF THE PREFERRED EMBODIMENTS

Figure 1:
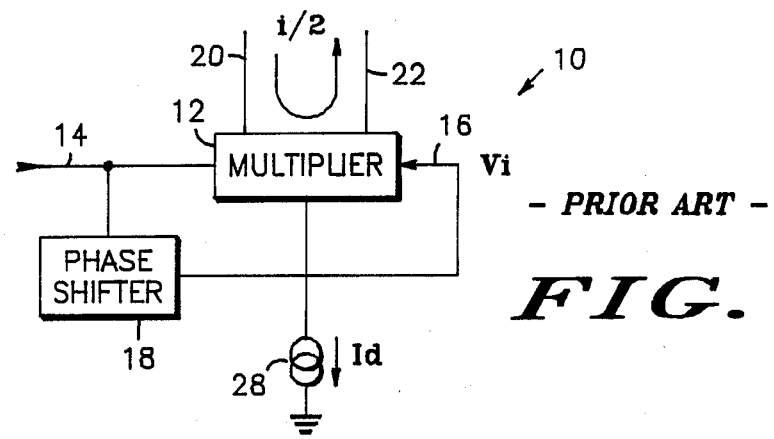
FIG. 1 is a partial block and schematic diagram illustrating a conventional quadrature detector of the type related to the present invention.

Turning to FIG. 1, there is illustrated conventional quadrature detector 10 which is suitable to be utilized in a frequency modulation (FM) receiver system for translating a frequency modulated input signal to an amplitude modulated output signal. Quadrature detector 10 is represented by multiplier or gating circuit 12 that generally may comprise three, interconnected differential amplifier gating circuits as understood, for example, see the aforereferenced '326 patent. Typically, a square wave switching reference signal, derived from the IF limiter section of the FM receiver, is supplied directly to multiplier 12 at input 14 thereof. Input 16 of multiplier 12 receives the signal from the IF limiter after it is passed through phase shifting network 18, which may be a single tuned LC tank circuit having a transfer characteristics:

$$\phi(w) = \tan^{-1} a + \frac{\pi}{2} \qquad (1)$$

where a is the normalized deviation, i.e., $$a = 2Q \frac{\Delta W}{W_c} \qquad (2)$$

and $\Delta W$ is the change in frequency, Wc the center frequency of the frequency modulated carrier frequency and Q the quality factor of the tank circuit as is understood. Thus, the LC circuit provides a signal that is in quadrature phase relation to the reference switching signal and multiplier circuit 12 is responsive to both the reference signal and this quadrature signal to provide an amplitude modulated output signal at differential outputs 20 and 22. As illustrated, a differential output current designated i/2 is produced at differential outputs 20 and 22 having a general transfer function of:

$$i = Id \frac{1}{\pi} \frac{Vi}{2V_T} \left( \frac{2a}{1 + a^2} \right) \qquad (3)$$

where i is the total differential current generated through multiplier 12, Id is the constant tail current sourced through current source 28, Vi is the voltage amplitude of the phase shifted input signal at the center frequency $W_C$, and thermal voltage, $V_T$ is equal to:

$$V_T = \frac{kT}{q} \qquad (4)$$

Figure 4:
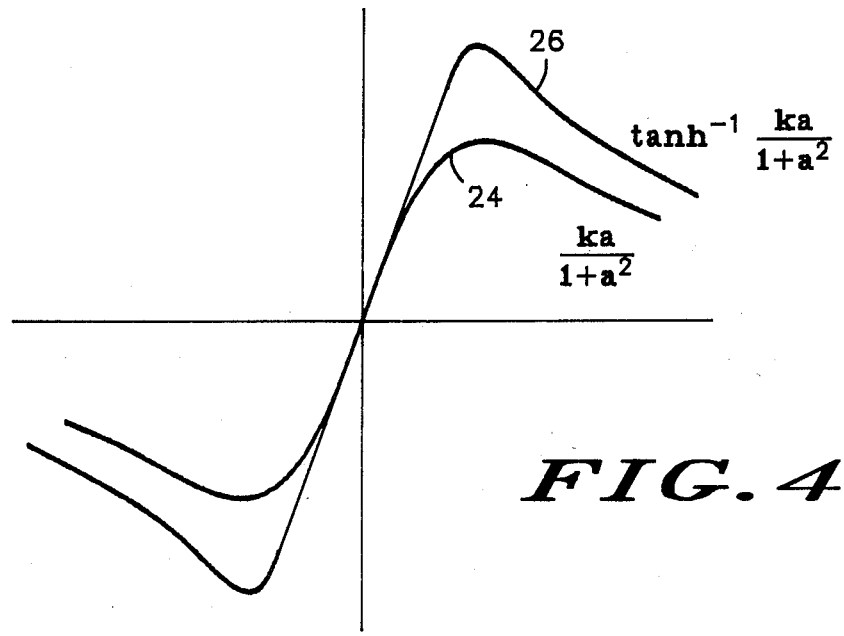
FIG. 4 illustrates waveforms useful for understanding the present invention.

Referring to FIG. 4, waveform 24 illustrates the general S-shaped curve output signal generated at the output of quadrature detector 10.

The linearity of the transfer function of quadrature detector 10 can be checked by modulating the normalized deviation and evaluating the harmonics thereof. Thus, by expanding, $$\frac{a}{1 + a^2} = a - a^3 + a^5 - a^7 \qquad (5)$$

and letting $a = A \cos \theta$, for small values of A, it can be shown that the third harmonic distortion (THD) for detector 10 is approximately 1.6% for a value of A=0.250 and approximately 6.2% for a value of A=0.500.

In order to reduce THD and to linearize the S-curve output characteristics of detector 10, a non-linear load circuit having a non-linear transfer characteristics is provided by the present invention which has its inputs coupled to the outputs 20 and 22 of multiplier 12 of quadrature detector 10.

Figure 2:
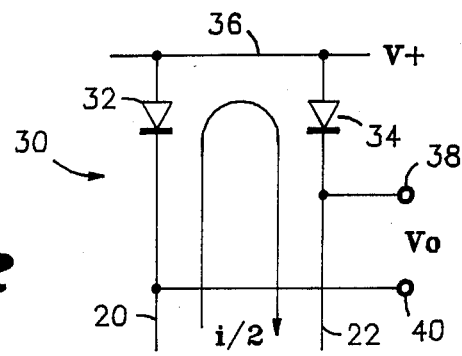
FIG. 2 is a schematic diagram illustrating a load circuit having a non-linear transfer characteristic of an embodiment of the present invention that is utilized with the quadrature detector of FIG. 1.

In one embodiment of the present invention, a non-linear load circuit 30, illustrated in FIG. 2, may be connected to outputs 20 and 22 of multiplier 12 and comprises a pair of matched diodes 32 and 34. Diodes 32 and 34 have their anodes connected to a common point such as power supply conductor 36 to which a operating power supply V+ is supplied thereto and respective cathodes coupled to the respective outputs 20 and 22 of multiplier 12. Thus, the load 30 comprises a pair of diode means 32 and 34 which provide a non-linear transfer characteristic at the output of multiplier 12 to produce a voltage across outputs 38 and 40 equal to a $\Delta 2V_{BE}$, where $V_{BE}$ is the voltage drop across each diode means 32 and 34. It is understood that, in monolithic integrated circuit form, diodes 32 and 34 may be manufactured by utilizing the base-emitter junctions of bipolar transistor structures.

It can be shown that diodes 32 and 34, having a sum of currents $I_O$ and a difference in currents equal to, i, will produce a difference in diode voltages across outputs 38 and 40 of:

$$V_0 = 2V_T \tanh^{-1} \left( \frac{i}{I_0} \right) \qquad (6)$$

Restricting diodes 32 and 34 to taking the same signal current, i, supplied at the output of multiplier 12, $$\frac{V_0}{2V_T} = \tanh^{-1} \frac{Id}{I_0} \frac{1}{\pi} \frac{Vi}{2V_T} \left( \frac{2a}{1 + a^2} \right) \qquad (7)$$

produces an output signal that is a function of:

$$\tanh^{-1} k \left( \frac{a}{1 + a^2} \right) \qquad (8)$$

This transfer characteristic is illustrated by waveform 26 of FIG. 4. Hence, the output signal of quadrature detector 10 is made more linear by using a load having a non-linear characteristics.

Equation (8), above, can be expanded in a similar manner as equation (5) to determine the amount of third harmonic distortion of the linearized output signal resulting from the use of load circuit 30. For $k=\sqrt{3}$ and small values of A, the third harmonic distortion of the output signal (waveform 26) can be shown to be equal to approximately 0.024% and 0.4% for values of A equal to 0.25 and 0.5 respectively. Hence, third harmonic distortion has been significantly reduced by the use of non-linear load circuit 30 in conjunction with quadrature detector 10.

Figure 3:
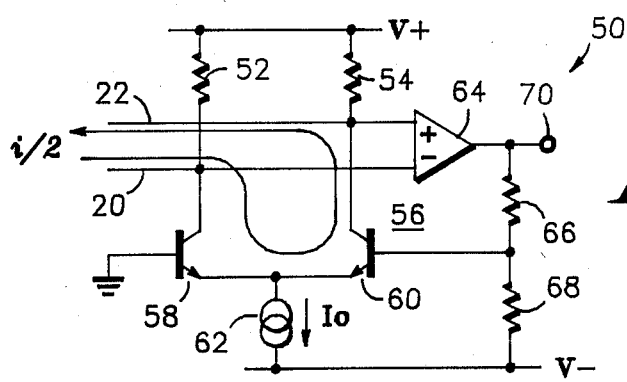
FIG. 3 is a partial block and schematic diagram illustrating a load circuit of an embodiment of the present invention which is suited to be coupled to the outputs of the quadrature detector of FIG. 1.

Turning to FIG. 3 there is shown load circuit 50 of a preferred embodiment of the invention which utilizes the concept of providing a non-linear load circuit at the outputs of multiplier 12. Resistors 52 and 54 provide DC current to multiplier 12. The differential output current i/2 produced at outputs 20 and 22 drives differential load means 56 comprising first electron control means or transistor 58 and second electron control means or transistor 60. As illustrated, the collector-emitter paths of transistors 58 and 60 are connected in series with the respective outputs 20 and 22 to source the differential output currents therefrom through differentially connected emitters. The emitters are connected to current source 62 which sources a constant tail current of $I_O$. The base of transistor 58 is coupled at a terminal to a reference potential which is generated at a different potential than the emitters of transistors 58 and 60 such that with the base of transistor 60 being supplied a feedback signal, differential amplifier 56 can sink the differential currents sourced at outputs 20 and 22. The feedback signal is provided by the feedback circuit comprising operational amplifier 64 which has its inverting and noninverting inputs coupled to the respective outputs 20 and 22 and its output coupled through the resistor divider circuit comprising resistor 66 and 68, at the interconnection therebetween, to the base of transistor 60. The output of the load circuit is taken at node 70.

In operation, operational amplifier 64 will provide current drive to the base of transistor 60 such that the base-to-emitter voltage derived thereat is that required for differential amplifier 56 to sink the differential current from multiplier 12. Hence, due to the non-linear transfer characteristics of the base-to-emitter junction of transistor 60, a linear voltage $V_O$, which has a linear transfer characteristic is derived at the interconnection between resistor 66 and 68. This voltage is multiplied by the resistor divider circuit to appear as an output voltage at output 70.

Figure 5:
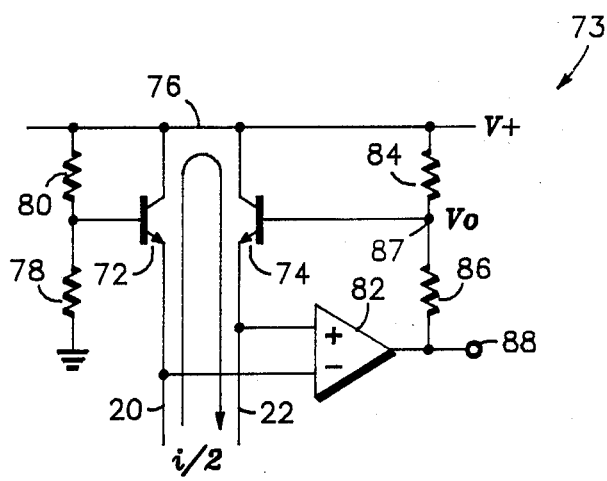
FIG. 5 is a partial block and schematic diagram of a load circuit of another embodiment of the present invention which is suited to be coupled to the output of the quadrature detector of FIG. 1.

Similarly, in another embodiment of the present invention illustrated in FIG. 5, a pair of transistors or electron control means 72 and 74 are provided as a differential load means, and have their collector-emitter paths connected in series between power supply conductor 76 and respective outputs 20 and 22 of multiplier 12 to produce an output voltage $V_O$ at node 87 which has a linear output characteristic derived from the non-linear characteristics of the base to emitter junction of transistor 74. In the embodiment illustrated in FIG. 5, the base of transistor 72 is maintained at a reference potential developed across resistor 78 which is connected in series between ground reference and power supply voltage V+ with resistor 80. A resistor divider network is coupled between power supply conductor 76 and the output of operational amplifier 82 comprising resistors 84 and 86 to multiply the linear output voltage $V_O$ developed at node 87 to produce a corresponding output voltage at output 88.

Hence, what has been described above, is a novel circuit and method for linearizing the output signal appearing at the output of a quadrature detector. By using a load having a non-linear characteristic connected to the differential output of a conventional single-tuned quadrature FM detector, an output voltage appears at the output thereof which is a more linear version of the normal S-curve characteristic of the detector.

I claim:

1. Load circuit for linearizing the output signal produced at the differential outputs of a quadrature detector comprising load means coupled to the differential outputs of the quadrature detector, said load means having a non-linear transfer characteristic for producing a voltage at an output thereof that is a more linear version of the output signal appearing at the differential outputs of the quadrature detector, said load means including differential amplifier means having first and second inputs and outputs, said first and second outputs being coupled to the differential outputs of the quadrature detector respectively, said first input being coupled to a terminal at which is supplied a reference potential; and feedback circuit means coupled between said first and second outputs of said differential amplifier means and said second input thereof for providing an amplified output signal at an output of said feedback circuit means which is said more linear version of the output signal produced at the differential outputs of the quadrature detector.

2. The circuit of claim 1 wherein said differential amplifier means includes:

first electron control means having first, second and control electrodes, said control electrode being said first input, said second electrode being coupled to the first one of the differential outputs of the quadrature detector;

second electron control means having first, second and control electrodes, said control electrode being said second input, said second electrode being coupled to the second one of the differential outputs of the quadrature detector; and a reference current source coupled to said first electrodes of said first and second electron control means.

3. The circuit of claim 2 wherein said feedback circuit means includes:

operational amplifier means having first and second inputs and an output, said first input being coupled to the first one of the differential outputs of the quadrature detector, said second input being coupled to the second one of the differential outputs of the quadrature detector, said output being said output of said feedback circuit means; and resistive divider circuit means coupled between said second input of said differential amplifier means and said output of said feedback circuit means.

4. The circuit of claim 1 wherein said differential amplifier means includes:

first electron control means having first, second and control electrodes, said first electrode being coupled to the first one of the differential outputs of the quadrature detector, said second electrode being coupled to a power supply conductor, said control electrode being said first input of said differential amplifier means; and second electron control means having first, second and control electrodes, said first electrode being coupled to the second one of the differential outputs of the quadrature detector, said second electrode being coupled to said power supply conductor, said control electrode being said second input of said differential amplifier means.

5. The circuit of claim 4 wherein said feedback circuit means includes:

operational amplifier means having first and second inputs and an output, said first input being coupled to said first output of said differential amplifier means, said second input being coupled to said second output of said differential amplifier means, said output being said output of the feedback circuit means; and resistive divider circuit means coupled between said second input of said differential amplifier means and said output of said feedback circuit means.

6. A quadrature detector including a multiplier circuit that is responsive to a reference input signal and a second input signal which is phase related to the reference input signal, the quadrature detector producing a differential output signal at differential outputs proportional to the phase difference between the two input signals, the differential output signal tending to be distorted by third harmonics of the input signals, the improvement comprising a load circuit coupled between said differential outputs of the multiplier circuit, said load circuit having a non-linear transfer characteristic for producing a more linear version of the differential output signal at an output thereof, said load circuit including first and second semiconductor PN junction means each having a non-linear transfer characteristic and being coupled to a respective one of the differential outputs of the multiplier circuit to source the differential output signal therethrough wherein said first semiconductor PN junction comprises a first electron control means having first, second and control electrodes, said control electrode being coupled to a terminal at which is supplied a reference potential, said first and second electrodes being coupled in series with a first one of the differential outputs of the multiplier circuit.

7. The quadrature detector of claim 6 wherein said second semiconductor PN junction means includes a second electron control means having first, second and control electrodes, said first and second electrodes being coupled in series with a second one of the differential outputs of the multiplier circuit, said control electrode receiving a feedback signal for biasing said second electron control means.

8. The quadrature detector of claim 7 including feedback circuit means having first and second inputs coupled to said first and second differential outputs of the multiplier circuit and an output coupled to said control electrode of said second electron control means for producing said feedback signal and said more linear version of the output signal at said output.

9. The quadrature detector of claim 8 wherein said feedback circuit means includes:
  an operational amplifier having first and second inputs and an output, said first and second inputs being said inputs of said feedback circuit means;
  resistive divider circuit coupled with said control electrode of said second electron control means and said output of said operational amplifier, said output of said operational amplifier being said output of the quadrature detector.

* * * * *